US012581835B2

(12) United States Patent
Fang et al.

(10) Patent No.: US 12,581,835 B2
(45) Date of Patent: Mar. 17, 2026

(54) DISPLAY PANEL

(71) Applicant: KunShan Go-Visionox Opto-Electronics Co., Ltd, Kunshan (CN)

(72) Inventors: Xuyang Fang, Kunshan (CN); Chao Chi Peng, Kunshan (CN); Mingxing Liu, Kunshan (CN); Panpan Wang, Kunshan (CN); Zhiyuan Zhang, Kunshan (CN); Shuaiyan Gan, Kunshan (CN)

(73) Assignee: KunShan Go-Visionox Opto-Electronics Co., Ltd, Kunshan (CN)

( * ) Notice: Subject to any disclaimer, the term of this patent is extended or adjusted under 35 U.S.C. 154(b) by 579 days.

(21) Appl. No.: 17/690,406

(22) Filed: Mar. 9, 2022

(65) Prior Publication Data

US 2022/0199722 A1     Jun. 23, 2022

Related U.S. Application Data

(63) Continuation of application No. PCT/CN2021/070157, filed on Jan. 4, 2021.

(30) Foreign Application Priority Data

Mar. 20, 2020     (CN) ......................... 202010202595.4
Mar. 20, 2020     (CN) ......................... 202010202602.0

(51) Int. Cl.
*H10K 59/80*     (2023.01)
*H10D 86/40*     (2025.01)
(Continued)

(52) U.S. Cl.
CPC ......... *H10K 59/873* (2023.02); *H10K 59/124* (2023.02); *H10K 59/878* (2023.02);
(Continued)

(58) Field of Classification Search
CPC .. H10K 50/844; H10K 59/873; H10K 59/878; H10K 59/124; H10K 59/1213; H10K 2102/311; H01L 27/124; G09F 9/33
See application file for complete search history.

(56) References Cited

U.S. PATENT DOCUMENTS

2018/0301658 A1*  10/2018  Chung ................... H10K 50/16
2020/0273926 A1*   8/2020  Lee ...................... H10K 50/822
(Continued)

FOREIGN PATENT DOCUMENTS

CN          107946341 A       4/2018
CN          108933196 A      12/2018
(Continued)

OTHER PUBLICATIONS

International Search Report (with English Translation) and Written Opinion mailed on Apr. 8, 2021 in corresponding International Application No. PCT/CN2021/070157, 11 pages.
(Continued)

*Primary Examiner* — Vongsavanh Sengdara
(74) *Attorney, Agent, or Firm* — Maier & Maier, PLLC

(57) ABSTRACT

A display panel including a main display area and a light-transmitting area, which is a non-main display area. The display panel includes a plurality of film layers arranged in a stack, a portion of the plurality of film layers is configured as light-transmitting layers, at least a portion of the light-transmitting layers is disposed in the light-transmitting area, and the display panel includes: at least one light modulation layer, each of the at least one light modulation layers is sandwiched between two of the light-transmitting layers disposed in the light-transmitting area, and the light modulation layer is configured to increase a transmittance of light of a preset wavelength between two light-transmitting layers sandwiching the light modulation layer.

10 Claims, 6 Drawing Sheets

(51) Int. Cl.
 H10D 86/60 (2025.01)
 H10K 59/121 (2023.01)
 H10K 59/124 (2023.01)
 H10K 102/00 (2023.01)

(52) U.S. Cl.
 CPC ........... *H10D 86/441* (2025.01); *H10D 86/60*
 (2025.01); *H10K 59/1213* (2023.02); *H10K*
 *2102/311* (2023.02)

(56) References Cited

U.S. PATENT DOCUMENTS

2021/0183983 A1* 6/2021 Bang .................... H10K 59/121
2021/0359266 A1* 11/2021 Bang .................... H10K 59/121

FOREIGN PATENT DOCUMENTS

| CN | 110047876 A | 7/2019 |
|---|---|---|
| CN | 110164928 A | 8/2019 |
| CN | 110289286 A | 9/2019 |
| CN | 110783484 A | 2/2020 |
| CN | 110890477 A | 3/2020 |
| CN | 111223912 A | 6/2020 |
| CN | 111370457 A | 7/2020 |

OTHER PUBLICATIONS

The notification to grant issued on Aug. 2, 2022, in corresponding
Chinese Application No. 202010202595.4, 7 pages.
The notification to grant issued on Aug. 18, 2022, in corresponding
Chinese Application No. 202010202602.0, 7 pages.

* cited by examiner

100

100

DISPLAY PANEL

CROSS-REFERENCE TO RELATED APPLICATIONS

This application is a continuation of International Application No. PCT/CN2021/070157, filed on Jan. 4, 2021, which claims priority to Chinese Patent Application No. 202010202602.0 filed on Mar. 20, 2020 and Chinese Patent Application No. 202010202595.4, filed on Mar. 20, 2020, all of which are hereby incorporated by reference in their entireties.

TECHNICAL FIELD

The present application relates to the technical field of display, and in particular to a display panel.

BACKGROUND

With the rapid development of electronic devices, users have higher and higher requirements for a screen-to-body ratio of an electronic device, such that display panels of electronic devices have attracted more and more attention in the industry.

Traditional electronic devices such as mobile phones and tablet computers need to integrate, for example, front cameras, earpieces, and infrared sensing components, etc. In the prior art, by providing a light-transmitting area on a display panel, external light can enter a photosensitive component located under a screen through the light-transmitting area on the screen. However, since the light-transmitting area of the display panel still has a stack of several film layers, a light transmittance of the light-transmitting area will be affected, and there is a problem of large difference in the light transmittance for light of different wavelengths.

SUMMARY

The embodiments of the present application provide a display panel.

The embodiments of the present application provide a display panel including a main display area and a light-transmitting area, wherein the main display area is arranged around at least part of the light-transmitting area, the display panel includes a plurality of film layers arranged in a stack, and comprising a plurality of light-transmitting layers, at least part of the light-transmitting layers being disposed in the light-transmitting area, and the display panel includes: at least one light modulation layer, wherein each of the at least one light modulation layers is sandwiched between two of the light-transmitting layers disposed in the light-transmitting area, and the light modulation layer is configured to increase a transmittance of light of a preset wavelength between two light-transmitting layers sandwiching the light modulation layer.

BRIEF DESCRIPTION OF THE DRAWINGS

By reading the following detailed description of non-limiting embodiments with reference to the drawings, other features, purposes and advantages of the present application will become more apparent, wherein the same or similar reference numbers indicate the same or similar features, and the drawings are not drawn according to an actual scale.

DETAILED DESCRIPTION

Figure 1:
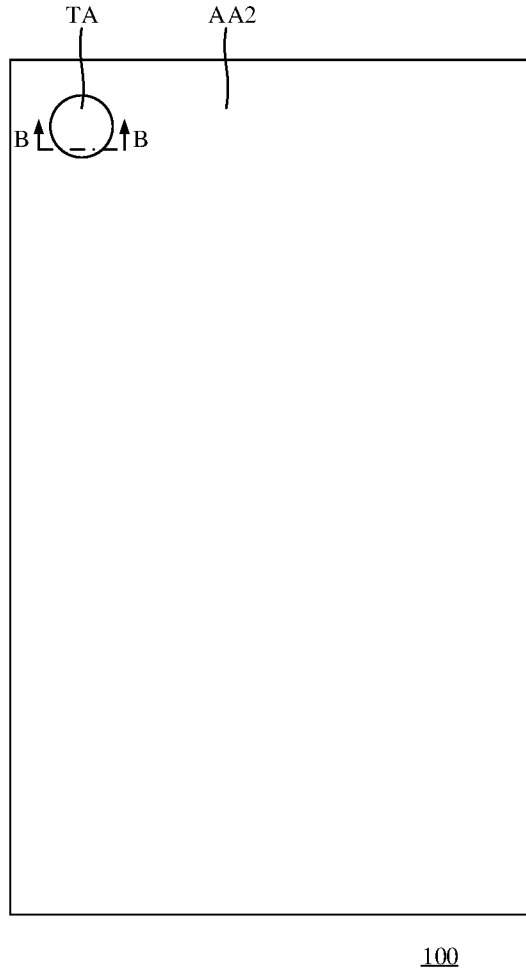
FIG. 1 is a schematic top view of a display panel according to a first embodiment of present application.

Features and exemplary embodiments of various aspects of the present application will be described in detail below. In order to make the purpose, technical solutions, and advantages of the present application clearer, the present application will be described in detail below with reference to the accompanying drawings and specific embodiments. It should be understood that the specific embodiments described herein are only configured to explain the present application, and not configured to limit the present application. For those skilled in the art, the present application can be implemented without some of these specific details. The following description of the embodiments is only to provide a better understanding of the present application by showing examples of the present application.

The embodiments of the present application provide a display panel, which may be an organic light emitting diode (OLED) display panel. The display panel includes a main display area and a light-transmitting area. The main display area is arranged around at least part of the light-transmitting area. The display panel includes a plurality of film layers arranged in a stack, the plurality of film layers comprises a plurality of light-transmitting layers, and at least part of the light-transmitting layers is disposed in the light-transmitting area. The display panel includes at least one light modulation layer, wherein each of the at least one light modulation layers is sandwiched between two of the light-transmitting layers disposed in the light-transmitting area, and the light modulation layer is configured to increase a transmittance of light of a preset wavelength between the two light-transmitting layers sandwiching the light modulation layer.

The display panel according to the embodiments of the present application includes the light-transmitting area, and the display panel can integrate a photosensitive component on the back of the light-transmitting area to realize under-screen integration of a photosensitive component such as a camera, wherein the main display area is arranged around at least part of the outer periphery of the light-transmitting area, which can reduce a width of a non-display area on an outer periphery of the main display area, thereby increasing a display area ratio of the display panel. A stack structure of light-transmitting film layers in the light-transmitting area of the display panel generally has a relative high light trans-mittance for some wavelengths of light, and has a relative low light transmittance for some wavelengths of light. The display panel of the embodiments of the present application includes at least one light modulation layer configured to increase a transmittance of light of a preset wavelength between the two light-transmitting layers sandwiching the light modulation layer, and thus the transmittance of some wavelengths of light with a low light transmittance can be increased to be close to or even equal to that of some wavelengths of light with a high light transmittance, which improves the uniformity of spectrum transmission and improves the color fidelity of transmitted light.

In some optional embodiments, the light-transmitting area is a non-display area. In some optional embodiments, the light-transmitting area is a secondary display area.

The following description will be given with the light-transmitting area being a non-display area.

Figure 2:
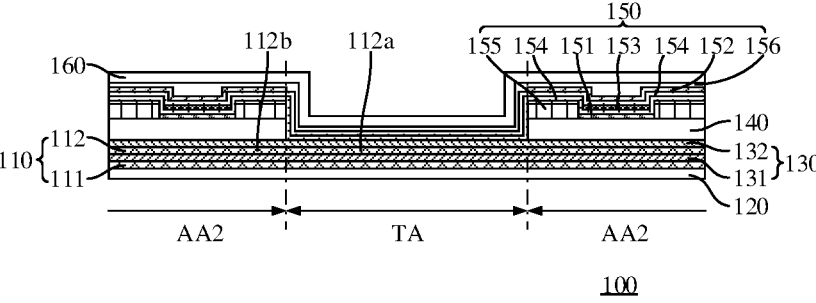
FIG. 2 is a schematic cross-sectional view of the display panel according to the first embodiment of present application.

FIGS. 1 and 2 are respectively a schematic top view and a schematic cross-sectional view of a display panel provided according to a first embodiment of the present application, wherein FIG. 2 shows a cross-section of a partial area of the display panel, and a line B-B in FIG. 1 shows a cut position of the schematic cross-sectional view. The display panel 100 includes a main display area AA2 and a light-transmitting area TA. The light-transmitting area TA is a non-display area, that is, the light-transmitting area TA does not form a light-emitting element and thus does not display. The main display area AA2 is arranged around at least part of the light-transmitting area TA. For example, in this embodi-ment, the light-transmitting area TA has a circular structure, and the main display area AA2 is arranged around all portions of the outer periphery of the light-transmitting area TA.

In some embodiments, an overall light transmittance of the display panel 100 in the light-transmitting area TA is more than 80%.

The display panel 100 includes a plurality of film layers arranged in a stack, and comprising a plurality of light-transmitting layers, and another portion of the plurality of film layers is configured as non-transmitting layers. The non-transmitting layers are disposed in the main display area AA2 and are not arranged in the light-transmitting area TA, and at least a portion of the light-transmitting layers are disposed in the light-transmitting area TA. That is, in the main display area AA2, multiple non-transmitting layers and multiple light-transmitting layers are stacked in a preset arrangement, and in the light-transmitting area TA, multiple light-transmitting layers are stacked. In the main display area AA2, the plurality of film layers can form a light-emitting element, so as to realize a display function of the display panel 100 in the main display area AA2.

In the display panel 100 of the embodiments of the present application, the display panel 100 may integrate a photo-sensitive component on the back of the light-transmitting area TA, so as to realize under-screen integration of a photosensitive component such as a camera. When a tradi-tional display panel integrates a photosensitive component, it is necessary to reserve a wide non-display area on an outer periphery of the main display area AA2 to place the photo-sensitive component correspondingly. In the display panel 100 of the embodiments of the present application, the main display area AA2 is arranged around at least a portion of the outer periphery of the light-transmitting area TA, and a photosensitive component may be integrated in the light-transmitting area TA, which can reduce a width of the non-display area on the outer periphery of the main display area AA2, thereby increasing a display area ratio of the display panel 100. Among the plurality of film layers of the display panel 100, the non-transmitting layers are disposed in the main display area AA2 and are not arranged in the light-transmitting area TA, so as to prevent the non-trans-mitting layers from blocking the light of the light-transmit-ting area TA and improve an overall light transmittance of the light-transmitting area TA.

A stack structure of light-transmitting film layers of the light-transmitting area TA of the display panel 100 generally has a relative high light transmittance for some wavelengths of light, and has a relative low light transmittance for some wavelengths of light. The display panel 100 of the embodi-ments of the present application includes at least one light modulation layer 110, wherein each of the at least one light modulation layers 110 is sandwiched between two of the light-transmitting layers disposed in the light-transmitting area TA, and the light modulation layer 110 is configured to increase a transmittance of light of a preset wavelength between the two light-transmitting layers sandwiching the light modulation layer 110. By arranging the light modula-tion layer 110, the transmittance of some wavelengths of light with a relative low light transmittance can be increased to be close to or even equal to that of some wavelengths of light with a relative high light transmittance, which improves the uniformity of spectrum transmission and improves the color fidelity of transmitted light.

Referring to FIG. 2, the display panel 100 may further include a substrate 120, a buffer layer 130, a group of device layers 140, a group of light-emitting element layers 150, and an encapsulation layer 160.

The substrate 120 is configured as a light-transmitting layer. In this embodiment, the display panel 100 is a flexible display panel, and the substrate 120 is, for example, a flexible transparent substrate made of materials such as polyimide (PI), polyethylene terephthalate (PET), etc. In some other embodiments, when the display panel 100 is a rigid display panel, the substrate 120 may also be a rigid transparent substrate made of materials such as glass.

The buffer layer 130 is located on the substrate 120, and the buffer layer 130 is configured as a light-transmitting layer. The group of device layers 140 is located on a side of the buffer layer 130 away from the substrate 120. The group of light-emitting element layers 150 is located on a side of the group of device layers 140 away from the substrate 120. The encapsulation layer 160 is located on a side of the group of light-emitting element layers 150 away from the substrate 120, and the encapsulation layer 160 is configured as a light-transmitting layer.

In the first embodiment of the present application, the substrate 120, the buffer layer 130, and the encapsulation layer 160 are disposed in the light-transmitting area TA, so that the display panel 100 has a stack structure of multiple light-transmitting layers in the light-transmitting area TA to ensure the light-transmitting area TA has a relatively high light transmittance. When an image capture device (for example, a camera) is provided on a side of the light-transmitting area TA of the display panel 100, an imaging clarity requirement of the image capture device can be met.

In some embodiments, the group of light-emitting element layers 150 includes a first electrode layer 151, a second electrode layer 152, and an emitting layer (EML) 153. The second electrode layer 152 is located on a side of the first electrode layer 151 away from the substrate 120. The emitting layer 153 is located between the first electrode layer 151 and the second electrode layer 152. One of the first electrode layer 151 and the second electrode layer 152 is an anode, and the other is a cathode. In this embodiment, the description is given by taking the first electrode layer 151 as an anode and the second electrode layer 152 as a cathode, for example.

The first electrode layer 151 may be configured as a light-transmitting layer or a non-transmitting layer. In this embodiment, the first electrode layer 151 is configured as a non-transmitting layer. The first electrode layer 151 may further include a first light-transmitting conductive layer, a reflective layer on the first light-transmitting conductive layer, and a second light-transmitting conductive layer on the reflective layer. The first light-transmitting conductive layer and the second light-transmitting conductive layer may be an indium tin oxide (ITO) layer or an indium zinc oxide (IZO) layer, etc., and the reflective layer may be a metal layer, for example, made of silver material.

The second electrode layer 152 may be configured as a light-transmitting layer. In some embodiments, the second electrode layer 152 may be a magnesium-silver alloy layer.

In this embodiment, the group of light-emitting element layers 150 further includes a carrier layer 154, which is located between the first electrode layer 151 and the emitting layer 153, and/or is located between the emitting layer 153 and the second electrode layer 152. For example, in this embodiment, a carrier layer 154 is provided between the first electrode layer 151 and the emitting layer 153, and between the emitting layer 153 and the second electrode layer 152. The carrier layer 154 is configured as a light-transmitting layer. In some other embodiments, the group of light-emitting element layers 150 may not be provided with the carrier layer 154.

Herein, the carrier layer refers to a carrier-related film layer used to realize functions of carrier (hole or electron) inject, transport, and blocking. In some embodiments, the carrier layer 154 between the first electrode layer 151 and the emitting layer 153 may include at least one of a hole inject layer (HIL), a hole transport layer (HTL), an electron blocking Layer (EBL). In some embodiments, the carrier layer 154 between the emitting layer 153 and the second electrode layer 152 may include at least one of an electron inject layer (EIL), an electron transport layer (Electron Transport Layer, ETL), and a hole blocking layer (HBL).

In some embodiments, the first electrode layer 151, the second electrode layer 152, and the emitting layer 153 are disposed in the main display area AA2 and are not arranged in the light-transmitting area TA, and the carrier layer 154 is disposed in the light-transmitting area TA. That is, a portion of film layers in the group of light-emitting element layers 150 is disposed in the light-transmitting area TA, and a portion of film layers in the group of light-emitting element layers 150 is disposed in the main display area AA2 and is arranged in the light-transmitting area TA. Although the second electrode layer 152 may be configured as a light-transmitting layer, in some embodiments, the second electrode layer 152 has a high degree of light absorption and reflection. Therefore, the second electrode layer 152 is not arranged in the light-transmitting area TA, which can further improve the overall light transmittance of the light-transmitting area TA.

In some embodiments, the group of light-emitting element layers 150 may not be provided with the carrier layer 154; in some embodiments, the group of light-emitting element layers 150 includes the carrier layer 154, however, the carrier layer 154 is disposed in the main display area AA2 and is arranged to vacate the light-transmitting area TA. That is, in these embodiments, the light-transmitting area TA of the display panel 100 is not provided with the carrier layer 154, and at this time, the light transmittance of the light-transmitting area TA of the display panel 100 for light of a blue light wavelength band is significantly improved.

In some embodiments, the group of light-emitting element layers 150 further includes a pixel definition layer 155 provided with a plurality of pixel openings. The first electrode layer 151 may include a plurality of patterned first electrodes, the emitting layer 153 may include a plurality of patterned light-emitting blocks, wherein the pixel openings are arranged in a one-to-one correspondence with the first electrodes and the light-emitting blocks, the pixel openings include at least a portion of the first electrodes, and the light-emitting blocks are located in the pixel openings. Each first electrode and the carrier layer 154, the light-emitting blocks, the carrier layer 154 and the second electrode layer 152 arranged in sequence on a side of the first electrode away from the substrate 120 form a light-emitting element.

In some embodiments, the group of light-emitting element layers 150 further includes a light extraction layer 156. The light extraction layer 156 is located on a side of the second electrode layer 152 away from the substrate 120. The light extraction layer 156 is configured as a light-transmitting layer, and the light extraction layer 156 is disposed in the light-transmitting area TA. In some embodiments, the group of light-emitting element layers 150 may not include the light extraction layer 156.

As shown in FIG. 2, in the first embodiment of the present application, at least one light modulation layer 110 includes a first light modulation layer 111 sandwiched between a substrate 120 and a buffer layer 130. The first light modulation layer 111 can increase a transmittance of light of a preset wavelength between the substrate 120 and the buffer layer 130, thereby increasing the overall light transmittance of the light-transmitting area TA, and increasing the transmittance of light of a preset wavelength with a low light transmittance to be close to or even equal to that of some wavelengths of light with a high light transmittance, which improves the uniformity of spectrum transmission and improves the color fidelity of transmitted light.

Optionally, in the first embodiment of the present application, the buffer layer 130 includes a first buffer sub-layer 131 and a second buffer sub-layer 132 arranged in a stack. The at least one light modulation layer 110 includes a second light modulation layer 112 sandwiched between the first buffer sub-layer 131 and the second buffer sub-layer 132. The second light modulation layer 112 can increase a transmittance of light of a preset wavelength between the first buffer sub-layer 131 and the second buffer sub-layer 132, thereby increasing the overall light transmittance of the light-transmitting area TA on one hand, and on the other hand, improving the uniformity of light transmission in each wavelength band, and improving the color fidelity of the transmitted light.

The first buffer sub-layer 131 may be a silicon nitride layer, and the second buffer sub-layer 132 may be a silicon oxide layer. The first light modulation layer 111 is a mixed film layer including at least two of silicon oxide, silicon nitride, and silicon. The second light modulation layer 112 is a mixed film layer including at least two of silicon oxide, silicon nitride, and silicon. By adjusting a composition ratio and thickness of the first light modulation layer 111 and the second light modulation layer 112 respectively, the first light modulation layer 111 and the second light modulation layer 112 can respectively have a significant anti-reflection effect.

In an example, the first light modulation layer 111 and the second light modulation layer 112 are both silicon oxynitride layers, that is, the first light modulation layer 111 and the second light modulation layer 112 are both mixed film layers formed by silicon oxide and silicon nitride. In some other embodiments, the first light modulation layer 111 and the second light modulation layer 112 may be other mixed film layers respectively, for example, a mixed film layer of silicon oxide and silicon, a doped quartz film layer, and the like. The first light modulation layer 111 and the second light modulation layer 112 may be formed by coating film through chemical vapor deposition (CVD), magnetron sputtering, coating, etc., respectively, or may be obtained by integrating on the substrate 120 supplied.

In some embodiments, a refractive index of the light modulation layer 110 is between refractive indexes of two light-transmitting layers sandwiching the light modulation layer 110, so as to ensure that the light modulation layer 110 can increase a light transmittance between two light transmission layers sandwiching the light modulation layer 110. For example, in the above-mentioned first embodiment, a refractive index of the first light modulation layer 111 is between a refractive index of the substrate 120 and a refractive index of the first buffer sub-layer 131 (buffer layer 130), and a refractive index of the second light modulation layer 112 is between the refractive index of the first buffer sub-layer 131 and a refractive index of the second buffer sub-layer 132.

In some embodiments, the refractive index of the light modulation layer 110 satisfies the following formula:

$$n_C = \sqrt{\left(\frac{1 - \sqrt{1-a}}{1 + \sqrt{1-a}}\right)(n_A \times n_B)} \quad (1)$$

wherein $n_A$ is a refractive index of one of the two light-transmitting layers sandwiching the light modulation layer 110; $n_B$ is a refractive index of the other one of the two light-transmitting layers sandwiching the light modulation layer 110; $n_C$ is the refractive index of the light modulation layer 110; a is an effective rate, wherein the effective rate $\alpha$ is greater than or equal to 60%. The higher a value of the effective rate $\alpha$, the closer the refractive index $n_C$ of the light modulation layer 110 is to a geometric mean $(\sqrt{N_A \times n_B})$ of refractive indexes $(n_A, n_B)$ of the two light-transmitting layers. The effective rate $\alpha$ being greater than or equal to 60% can ensure that the light modulation layer 110 can enhance a transmittance of light of a preset wavelength between the two light-transmitting layers.

In some embodiments, the refractive index of the light modulation layer 110 satisfies the following formula:

$$n_C = \sqrt{n_A \times n_B} \quad (2)$$

8 wherein $n_A$ is a refractive index of one of the two light-transmitting layers sandwiching the light modulation layer 110; $n_B$ is a refractive index of the other one of the two light-transmitting layers sandwiching the light modulation layer 110; $n_C$ is the refractive index of the light modulation layer 110. It is equivalent to configuring the effective rate $\alpha$ in the formula (1) to be 100% to obtain the formula (2). When the refractive index $n_C$ of the light modulation layer 110 satisfies the formula (2), a better value of the refractive index $n_C$ of the light modulation layer 110 is obtained, and at this time, the light modulation layer 110 can greatly increase a transmittance of light of a preset wavelength between the two light-transmitting layers. The effective rate $\alpha$ in the above formula (1) may be understood as a degree of effectiveness that a modulation performance of the light modulation layer 110 can achieve a better modulation performance (modulation performance corresponding to a better value of the refractive index $n_C$).

The description is given by taking a configuration manner of the refractive index of the second light modulation layer 112 as an example, wherein the refractive index of the first buffer sub-layer 131 is substituted into $n_A$ in the formula (1), and the refractive index of the second buffer sub-layer 132 is substituted into $n_B$ in the formula (1). The effective rate is, for example, 100%, and a better value of the refractive index $n_C$ of the second light modulation layer 112 is obtained at this time; the effective rate is, for example, 96%, and the refractive index $n_C$ of the second light modulating layer 112 under a condition that the effective rate is 96% is obtained at this time.

In some embodiments, each of the at least one light modulation layers 110 includes a first portion located in the light-transmitting area TA, and a thickness of the first portion satisfies the following formula:

$$T_C \times n_C = (2M+1) \times \lambda/4 \quad (3)$$

wherein $T_C$ is the thickness of the first portion of the light modulation layer 110; $n_C$ is the refractive index of the light modulation layer 110; $\lambda$ is a wavelength of light of a preset wavelength; and M is a natural number. The wavelength $\lambda$ of the light of the preset wavelength is a wavelength of light of a required adjustment wavelength, and its dimension is consistent with a dimension of the thickness $T_C$ of the first portion of the light modulation layer 110, wherein the dimension is, for example, nanometers.

In some embodiments, each of the at least one light modulation layers 110 includes a first portion located in the light-transmitting area TA, and at least one light modulation layer 110 includes a second portion located in the main display area AA2. As shown in FIG. 2, for example, in this embodiment, the second light modulation layer 112 includes a first portion 112a and a second portion 112b, wherein the first portion 112a of the second light modulation layer 112 is located in the light-transmitting area TA, and the second portion 112b is located in the main display area AA2.

The description is given by taking a configuration manner of a thickness of the first portion 112a of the second light modulation layer 112 as an example, wherein the refractive index of the second light modulation layer 112 is substituted into $n_C$ in the formula (3), the wavelength of the light of the preset wavelength is substituted into 2 in the formula (3), and a natural number is substituted into M in formula (3), to obtain the thickness $T_C$ of the first portion 112a of the light modulation layer 110. In an example, the wavelength $\lambda$ of the light of the preset wavelength is, for example, 500 nanometers, and the thickness $T_C$ of the first portion 112a of the light modulation layer 110 obtained at this time can increase a transmittance of light of a wavelength of 500 nanometers between the first buffer sub-layer 131 and the second buffer sub-layer 132. According to properties of the spectrum itself, a transmittance between the first buffer sub-layer 131 and the second buffer sub-layer 132 will also increase to a certain extent for light of a range of wavelengths close to 500 nanometers (for example, light of a wavelength of 490 nanometers). Moreover, according to properties of the spectrum itself, a transmittance of light of a wavelength of an integer multiple of 500 nanometers (for example, light of a wavelength of 1000 nanometers) between the first buffer sub-layer 131 and the second buffer sub-layer 132 will also increase.

According to the display panel 100 of the embodiments of the present application, by providing the light modulation layer 110, on one hand, due to its anti-reflection effect, the overall light transmittance of the light-transmitting area TA can be increased; on the other hand, the light modulation layer 110 can increase the transmittance of some wavelengths of light with a relative low light transmittance to be close to or even equal to that of some wavelengths of light with a relative high light transmittance, which improves the uniformity of spectrum transmission and improves the color fidelity of transmitted light.

Figure 3:
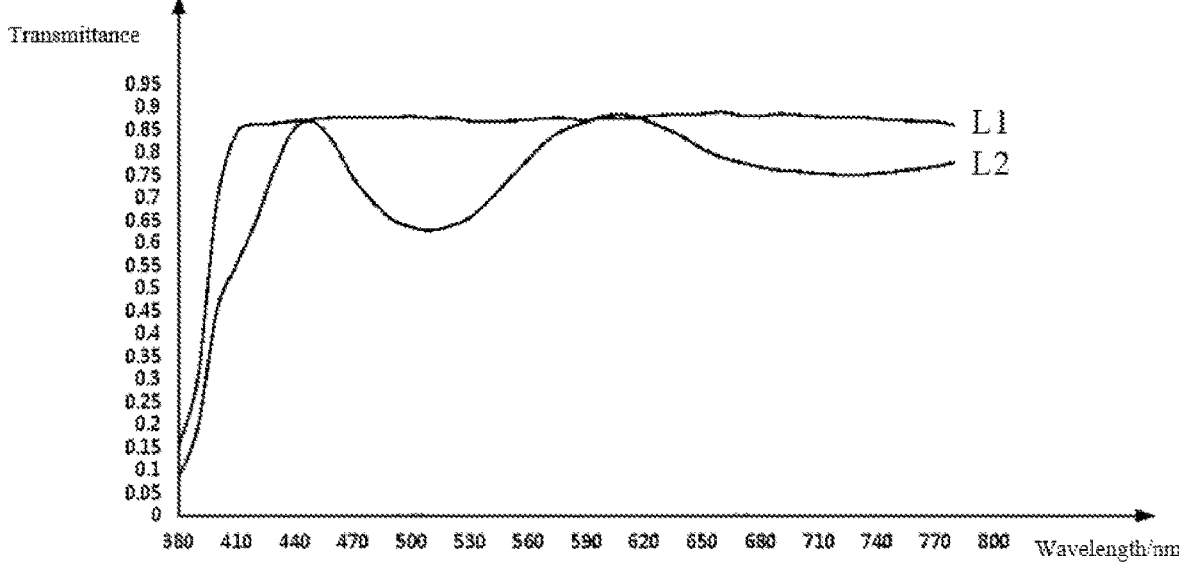
FIG. 3 is a graph showing transmittances of various wavelengths of light of the display panel according to the first embodiment of present application.

FIG. 3 is a graph showing transmittances of various wavelengths of light of the display panel provided according to the first embodiment of the present application. For comparison, FIG. 3 also shows a curve of transmittances of a display panel of a comparative example for various wavelengths of light. In the comparative example, except that the light modulation layer 110 is not provided, the remaining structure is the same as the structure of the first embodiment of the present application. Through an ellipsometer, transmittances of the display panel of the first embodiment and the display panel of the comparative example for various wavelengths of light can be measured, and the graph shown in FIG. 3 can be obtained according to a corresponding relationship between wavelengths and transmittances. In FIG. 3, a curve L1 is a transmittance curve of the display panel of the first embodiment for various wavelengths of light, and a curve L2 is a transmittance curve of the display panel of the comparative example for various wavelengths of light.

According to the comparison between the display panel of the first embodiment and the display panel of the comparative example, an overall transmittance of a light-transmitting area of the display panel of the comparative example for light is 76.12%, and an overall transmittance of the light-transmitting area of the display panel of the first embodiment of the present application for light is 87.28%. It can be seen that by providing the light modulation layer 110, the overall light transmittance of the light-transmitting area of the display panel can be significantly improved. The uniformity of a transmittance spectrum of the display panel of the first embodiment and the display panel of the comparative example has been tested. A standard deviation of the transmittance of the display panel of the comparative example for light of wavelengths from 410 nanometers (nm) to 780 nm is 0.08, and a standard deviation of the transmittance of the display panel of the first embodiment for light of wavelengths from 410 nm to 780 nm is 0.01. It can be seen that by providing the light modulation layer 110, the uniformity of the transmittance spectrum of the display panel can be significantly improved.

As mentioned above, the at least one light modulation layer 110 includes both the first portion located in the light-transmitting area TA and the second portion located in the main display area AA2. Film layers adjacent to two surfaces of the first portion of the light modulation layer 110 in the light-transmitting area TA may be the same as film layers adjacent to two surfaces of the second portion of the light modulation layer 110 in the main display area AA, or at least one layer may be different. The thickness of the second portion of the light modulation layer 110 may be the same as or different from the thickness of the first portion, and it is configured based on a modulation effect requirement of the light modulation layer 110 in the light-transmitting area TA and the main display area AA2. When the film layers adjacent to the two surfaces of the first portion and the film layers adjacent to the two surfaces of the second portion are the same, and the thickness of the second portion is the same as the thickness of the first portion, a modulation effect of the second portion and a modulation effect of the first portion are the same. When at least one layer of the film layers adjacent to the two surfaces of the first portion is different from the film layers adjacent to the two surfaces of the second portion, and/or the thickness of the second portion is different from the thickness of the first portion, the modulation effect of the second portion and the modulation effect of the first portion are different.

In the foregoing embodiments, the light modulation layer 110 is provided at the substrate 120 and the buffer layer 130 as an example for description, so that an interference of the substrate 120 and the buffer layer 130 on a chromaticity fidelity of the transmitted light can be reduced. The light modulation layer 110 may also be arranged at other film layers of the display panel to improve the interference of the other film layers on the chromaticity fidelity of the transmitted light.

Figure 4:
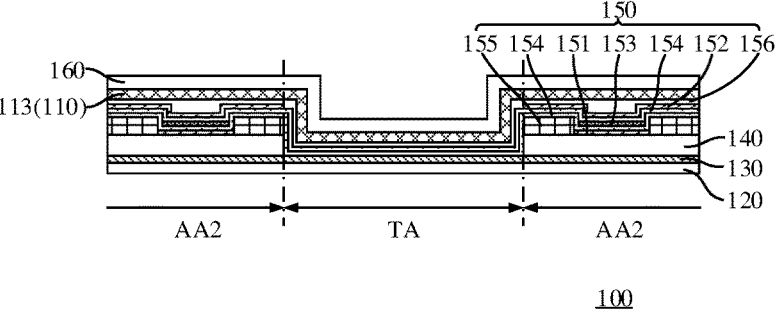
FIG. 4 is a schematic cross-sectional view of a display panel according to a second embodiment of present application.

FIG. 4 is a schematic cross-sectional view of a display panel provided according to a second embodiment of the present application, wherein FIG. 4 illustrates a cross-section of a partial area of the display panel. Most of the structure of the display panel provided by the second embodiment is the same as the display panel provided by the first embodiment. The differences between the second embodiment and the first embodiment will be described below, and the similarities will not be described in detail.

The differences from the first embodiment are that, in the second embodiment, the group of light-emitting element layers 150 is separate from the encapsulation layer 160 and the at least one light modulation layer 110 includes a third light modulation layer 113 filled between the encapsulation layer 160 and the group of light-emitting element layers 150.

In this embodiment, the group of light-emitting element layers 150 includes a first electrode layer 151, a second electrode layer 152, an emitting layer 153, a carrier layer 154, a pixel definition layer 155, and a light extraction layer 156. The first electrode layer 151, the second electrode layer 152, and the emitting layer 153 is disposed in the main display area AA2 and vacate the light-transmitting area TA, and the carrier layer 154 and the light extraction layer 156 are disposed in the light-transmitting area TA. In some embodiments, the group of light-emitting element layers 150 may not include the light extraction layer 156.

The third light modulation layer 113 is, for example, a lithium fluoride layer. In this embodiment, the third light modulation layer 113 can increase a transmittance of light of a preset wavelength between the encapsulation layer 160 and the group of light-emitting element layers 150 (the light extraction layer 156), thereby improving the overall light transmittance of the light-transmitting area TA on one hand, and on the other hand, improving the uniformity of light transmission in each wavelength band, and improving the color fidelity of the transmitted light.

In this embodiment, the display panel 100 may be a flexible display panel. Correspondingly, the encapsulation layer 160 is a thin-film encapsulation structure. In some embodiments, the encapsulation layer 160 includes at least one inorganic encapsulation layer and at least one organic encapsulation layer that are stacked.

In the above embodiments, the description is given by taking the display panel 100 as a flexible display panel as an example. However, the concept of the present application may not be limited to being applied to a flexible display panel, but can also be applied to a rigid display panel. For example, in the above second embodiment, the display panel 100 may be a rigid display panel, wherein the encapsulation layer 160 may be an encapsulation cover made of materials such as glass or the like, the group of light-emitting element layers 150 and the encapsulation layer 160 are arranged to be separated, and the at least one light modulation layer 110 includes the third light modulation layer 113 filled between the encapsulation layer 160 and the group of light-emitting element layers 150. The third light modulation layer 113 may be formed by inkjet printing, coating, or the like.

Figure 5:
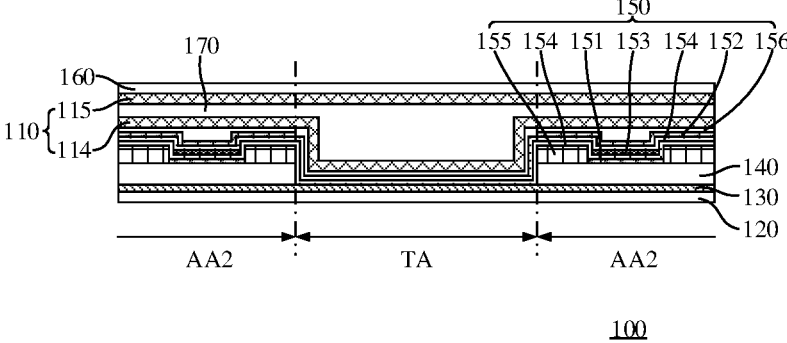
FIG. 5 is a schematic cross-sectional view of a display panel according to a third embodiment of present application.

FIG. 5 is a schematic cross-sectional view of a display panel provided according to a third embodiment of the present application, wherein FIG. 5 illustrates a cross-section of a partial area of the display panel. Most of the structure of the display panel provided by the third embodiment is the same as the display panel provided by the first embodiment. The differences between the third embodiment and the first embodiment will be described below, and the similarities will not be described in detail.

The differences from the first embodiment are that, in the third embodiment, the display panel 100 is a rigid display panel, and the encapsulation layer 160 is an encapsulation cover made of materials such as glass or the like.

In addition, the display panel 100 further includes a vacuum layer 170, and the vacuum layer 170 is located between the group of light-emitting element layers 150 and the encapsulation layer 160.

The at least one light modulation layer 110 includes at least any one of: a fourth light modulation layer 114 and a fifth light modulation layer 115, wherein the fourth light modulation layer 114 is located between the group of light-emitting element layers 150 and the vacuum layer 170; the fifth light modulation layer 115 is located between the encapsulation layer 160 and the vacuum layer 170. For example, in this embodiment, the at least one light modulation layer 110 includes both the fourth light modulation layer 114 and the fifth light modulation layer 115.

In some embodiments, the fourth light modulation layer 114 is a lithium fluoride layer, which may be formed by evaporation, electron beam evaporation, or the like. In some embodiments, the fifth light modulation layer 115 is a magnesium fluoride layer, which may be formed by magnetron sputtering, electron beam evaporation, or the like. In some embodiments, the fourth light modulation layer 114 and/or the fifth light modulation layer 115 may be obtained by integrating on the encapsulation layer 160 supplied.

In some other embodiments, the fourth light modulation layer 114 may be another material layer with a refractive index lower than that of a film layer (the light extraction layer 156) closest to the vacuum layer 170 in the group of light-emitting element layers 150; the fifth light modulation layer 115 may be another material layer with a refractive index lower than that of the encapsulation layer 160.

The fourth light modulation layer 114 can increase a transmittance of light of a preset wavelength between the group of light-emitting element layers 150 and the vacuum layer 170, and the fifth light modulation layer 115 can increase a transmittance of light of a preset wavelength between the encapsulation layer 160 and the vacuum layer 170. By providing the fourth light modulation layer 114 and/or the fifth light modulation layer 115, the overall light transmittance of the light-transmitting area TA is increased, and an interference of the encapsulation layer 160 on the chromaticity fidelity of the transmitted light is reduced.

In the above embodiments, it is described that the modulation layer 110 may be provided at the substrate 120, the buffer layer 130, and the encapsulation layer 160 respectively, and the above embodiments can be combined with each other if the technical solutions do not conflict. For example, in one embodiment, the at least one light modulation layer 110 of the display panel 100 includes the first light modulation layer 111, the fourth light modulation layer 114, and the fifth light modulation layer 115, wherein the first light modulation layer 111 is sandwiched between the substrate 120 and the buffer layer 130, the fourth light modulation layer 114 is located between the group of light-emitting element layers 150 and the vacuum layer 170, and the fifth light modulation layer 115 is located between the encapsulation layer 160 and the vacuum layer 170.

In addition, the film layers of the group of device layers 140 may include a plurality of wiring layers for wiring. The wiring layers may be made of metal and configured as non-transmitting layers. The film layers of the group of device layers 140 may also include light-transmitting layers such as a capacitor dielectric layer, a gate insulating layer, and an interlayer dielectric layer. At least one of the light-transmitting layers such as the capacitor dielectric layer, the gate insulating layer, and the interlayer dielectric layer may be disposed in the light-transmitting area TA.

Figure 6:
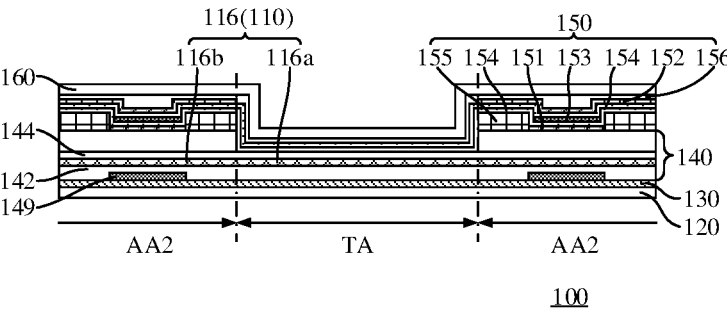
FIG. 6 is a schematic cross-sectional view of a display panel according to a fourth embodiment of present application.

FIG. 6 is a schematic cross-sectional view of a display panel provided according to a fourth embodiment of the present application, wherein FIG. 6 illustrates a cross-section of a partial area of the display panel. Most of the structure of the display panel provided by the fourth embodiment is the same as the display panel provided by the first embodiment. The differences between the fourth embodiment and the first embodiment will be described below, and the similarities will not be described in detail.

FIG. 6 exemplarily shows the gate insulating layer 142 and the interlayer dielectric layer 144 included in the group of device layers 140, wherein the interlayer dielectric layer 144 is located on a side of the gate insulating layer 142 away from the substrate 120. The gate insulating layer 142 and the interlayer dielectric layer 144 are configured as light-transmitting layers, and both extend in the main display area AA2 and cover the light-transmitting area TA. It can be understood that, although not shown in the figures, the group of device layers 140 may also include other film layers such as a wiring layer, a flat layer, etc.

In some embodiments, the group of device layers 140 includes a thin film transistor, and the thin film transistor includes an active layer 149. In this embodiment, the gate insulating layer 142 is arranged to cover the active layer 149, that is, the gate insulating layer 142 is located on a side of the active layer 149 away from the substrate 120. The at least one light modulation layer 110 includes a sixth light modulation layer 116. The sixth light modulation layer 116 includes a first portion 116*a* located in the light-transmitting area TA and a second portion 116b located in the main display area AA2. The second portion 116b of the sixth light modulation layer 116 is located on a side of the active layer 149 away from the substrate 120. In this embodiment, in the light-transmitting area TA, the first portion 116a of the sixth light modulation layer 116 is sandwiched between the gate insulating layer 142 and the interlayer dielectric layer 144.

In this embodiment, in the light-transmitting area TA, the first portion 116a of the sixth light modulation layer 116 is configured to increase a transmittance of light of a preset wavelength between the two light-transmitting layers sandwiching the first portion 116a. In the main display area AA2, the second portion 116b of the sixth light modulation layer 116 is configured to reduce a transmittance of light between two film layers sandwiching the second portion 116b. Therefore, in the light-transmitting area TA, the first portion 116a of the sixth light modulation layer 116 can increase the overall light transmittance of the light-transmitting area TA, and can improve the uniformity of light transmission in each wavelength band, and improve the color fidelity of the transmitted light. In the main display area AA2, the active layer 149 of the thin film transistor is usually made of a semiconductor material, which has a photoelectric effect on light. By reducing a light transmittance through the second portion 116b of the sixth light modulation layer 116d, propagation of light from the group of light-emitting element layers 150 and outside to the active layer 149 can be reduced, thereby reducing an influence of light on a channel of the active layer 149 and improving the stability of the thin film transistor.

Different configurations are performed on the first portion 116a and the second portion 116b of the sixth light modulation layer 116 respectively, so that the two portions may have different light transmittance properties. In some embodiments, the first portion 116a and the second portion 116b of the sixth light modulation layer 116 may be configured with different refractive indexes respectively. In some embodiments, a thickness of the second portion 116b of the sixth light modulation layer 116 is different from a thickness of the first portion 116a of the sixth light modulation layer 116, so that the first portion 116a is configured to increase a transmittance of light of a preset wavelength between the two light-transmitting layers sandwiching the first portion 116a, and the second portion 116b is configured to reduce a transmittance of light between two film layers sandwiching the second portion 116b.

In some embodiments, when the at least one light modulation layer 110 includes a seventh modulation layer located on a side of the active layer 149 facing the substrate 120, the seventh modulation layer may also include a first portion located in the light-transmitting area TA and a second portion located in the main display area AA2. The first portion and the second portion of the seventh modulation layer are both configured to increase a transmittance of light of a preset wavelength between the two film layers sandwiching the seventh modulation layer, so that after the light from the group of light-emitting element layers 150 and the outside passes through the active layer 149, light reflected back to the active layer 149 is reduced, which improves the stability of the thin film transistor.

The following description will be given with the light-transmitting area being a secondary display area.

Figures 7, 8:
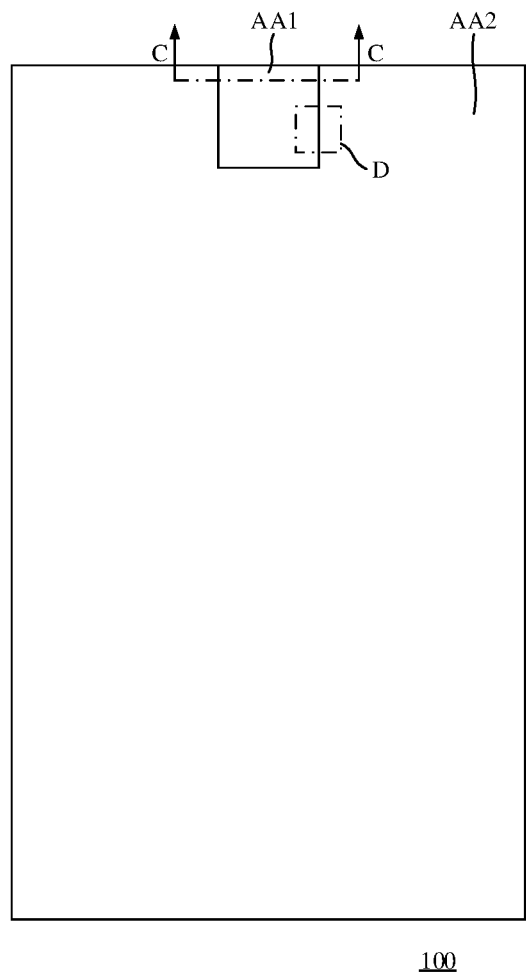
FIG. 7 is a schematic top view of a display panel according to a fifth embodiment of present application.
FIG. 8 is a schematic cross-sectional view of the display panel according to the fifth embodiment of present application.

FIGS. 7 and 8 are respectively a schematic top view and a schematic cross-sectional view of a display panel provided according to a fifth embodiment of the present application, wherein FIG. 8 shows a cross-section of a partial area of the display panel, and a line C-C in FIG. 7 shows a cut position of the schematic cross-sectional view. The display panel 100 includes a secondary display area AA1 and a main display area AA2. The secondary display area AA1 may also be regarded as a light-transmitting area, and its light transmittance is greater than that of the main display area AA2. In this embodiment, the main display area AA2 is arranged around a part of the secondary display area AA1. In other embodiments, the main display area AA2 may be arranged around the entire outer periphery of the secondary display area AA1. In this embodiment, the secondary display area AA1 has a polygonal shape. In other embodiments, the secondary display area AA1 may have other shapes such as a circle, a fan, and the like.

The display panel 100 includes a plurality of film layers arranged in a stack, and comprising a plurality of light-transmitting layers. It is understood that the remaining portion of the plurality of film layers may be configured as non-transmitting layers. At least a portion of the light-transmitting layers are disposed in the secondary display area AA1.

Herein, a light transmittance of the secondary display area AA1 is greater than or equal to 15%. In order to ensure that the light transmittance of the secondary display area AA1 is greater than 15%, even greater than 40%, and even a higher light transmittance, a light transmittance of each light-transmitting layer of the display panel 100 disposed in the secondary display area AA1 in this embodiment is more than 80%, and the light transmittance of at least a portion of the light-transmitting layers is even greater than 90%.

For the display panel 100 according to the embodiments of the present application, the light transmittance of the secondary display area AA1 is greater than a light transmittance of the main display area AA2, so that the display panel 100 can integrate a photosensitive component on the back of the secondary display area AA1 to realize under-screen integration of a photosensitive component such as a camera, and at the same time, the secondary display area AA1 can display an image, which increases a display area of the display panel 100 and realizes a full-screen design of a display device.

For the display panel 100 according to the embodiments of the present application, among the multiple film layers of the display panel 100, at least a portion of the light-transmitting layers are disposed in the secondary display area AA1. A stack structure of film layers of the secondary display area AA1 generally has a relative high light transmittance for some wavelengths of light, and has a relative low light transmittance for some wavelengths of light. The display panel of the embodiments of the present application includes at least one light modulation layer 110, wherein each of the at least one light modulation layers 110 is sandwiched between two of the light-transmitting layers disposed in the secondary display area AA1, and the light modulation layer 110 is configured to increase a transmittance of light of a preset wavelength between the two light-transmitting layers sandwiching the light modulation layer 110. By arranging the light modulation layer 110, the transmittance of some wavelengths of light with a relative low transmittance can be increased to be close to or equal to the transmittance of wavelengths with a relative high transmittance, which improves the uniformity of spectrum transmission and improves the color fidelity of transmitted light.

Referring to FIG. 8, the display panel 100 may further include a substrate 120, a group of device layers 140, a group of light-emitting element layers 150, and an encapsulation layer 160.

The substrate 120 is configured as a light-transmitting layer. In this embodiment, the display panel 100 is a flexible display panel, and the substrate 120 is, for example, a flexible transparent substrate made of materials such as polyimide (PI), polyethylene terephthalate (PET), etc. In some other embodiments, when the display panel 100 is a rigid display panel, the substrate 120 may also be a rigid transparent substrate made of materials such as glass.

The group of device layers 140 is located on the substrate 120, the group of device layers 140 includes a plurality of device sub-layers, and at least a portion of the plurality of device sub-layers is configured as light-transmitting layers. The group of light-emitting element layers 150 is located on a side of the group of device layers 140 away from the substrate 120. The encapsulation layer 160 is located on a side of the group of light-emitting element layers 150 away from the substrate 120, and the encapsulation layer 160 is configured as a light-transmitting layer. At least a portion of the light-transmitting layers in the group of device layers 140, the substrate 120, the group of light-emitting element layers 150, and the encapsulation layer 160 are disposed in the secondary display area AA1, so that at least a portion of the display panel 100 in the secondary display area AA1 is a stack structure of multiple light-transmitting layers to ensure that the secondary display area AA1 has a relative high light transmittance. When an image capture device (for example, a camera) is provided on a side of the secondary display area AA1 of the display panel 100, an imaging clarity requirement of the image capture device can be met.

In this embodiment, the group of device layers 140 includes a buffer layer 130, a gate insulating layer 142, a capacitor dielectric layer 143, and a planarization layer 145. The buffer layer 130 is located on the substrate 120. The gate insulating layer 142 is located on a side of the buffer layer 130 away from the substrate 120. The capacitor dielectric layer 143 is located on a side of the gate insulating layer 142 away from the substrate 120. The interlayer dielectric layer 144 is located on a side of the capacitor dielectric layer 143 away from the substrate 120. The planarization layer 145 is located on a side of the interlayer dielectric layer 144 away from the substrate 120.

In some embodiments, the buffer layer 130, the gate insulating layer 142, the capacitor dielectric layer 143, the interlayer dielectric layer 144, and the planarization layer 145 are configured as light-transmitting layers, and at least one of the buffer layer 130, the gate insulating layer 142, the capacitor dielectric layer 143, or the interlayer dielectric layer 144 is disposed in the secondary display area AA1. For example, in this embodiment, the buffer layer 130, the gate insulating layer 142, the capacitor dielectric layer 143, and the interlayer dielectric layer 144 all extend both in the secondary display area AA1 and the main display area AA2.

Figure 9:
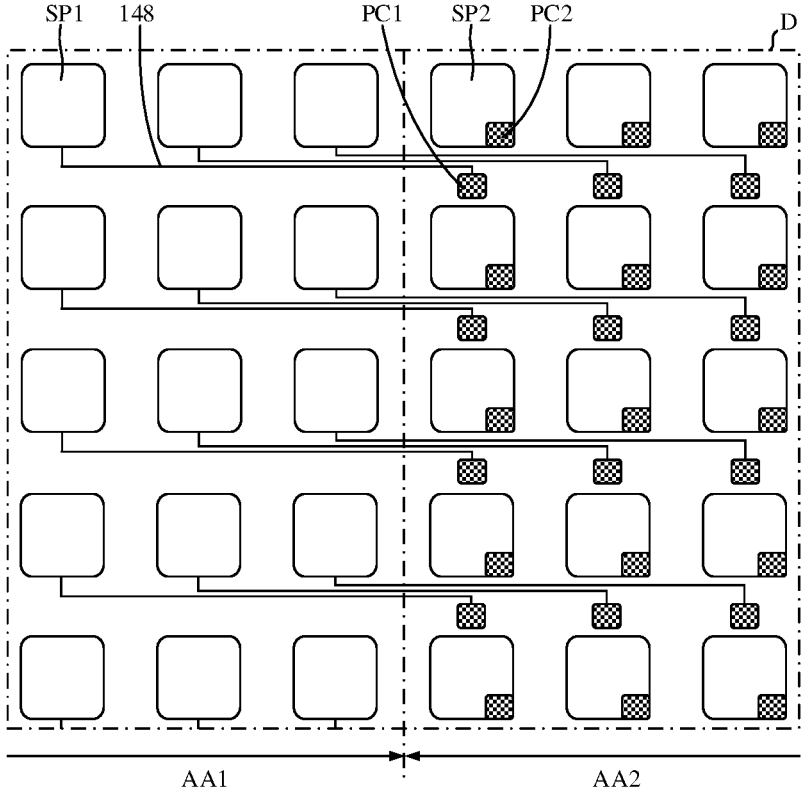
FIG. 9 is a partial enlarged schematic diagram of an area D in FIG. 7.

FIG. 9 is a partial enlarged schematic diagram of an area D in FIG. 7. In some embodiments, the display panel 100 further includes a first light-emitting element SP1, a second light-emitting element SP2, a first pixel circuit PC1, and a second pixel circuit PC2. The first light-emitting element SP1 and the second light-emitting element SP2 are located in the group of light-emitting element layers 150. The first light-emitting element SP1 is arranged in the secondary display area AA1, and the second light-emitting element SP2 is arranged in the main display area AA2. The first pixel circuit PC1 and the second pixel circuit PC2 are located in the group of device layers 140. The first pixel circuit PC1 is electrically connected to the first light-emitting element SP1 for driving the first light-emitting element SP1 to display. The second pixel circuit PC2 is electrically connected to the second light-emitting element SP2 for driving the second light-emitting element SP2 to display. The first pixel circuit PC1 and the second pixel circuit PC2 are both arranged in the main display area AA2. At least a portion of the structure of the first pixel circuit PC1 and the second pixel circuit PC2 has a relative low light transmittance or has no light transmission. By arranging the first pixel circuit PC1 and the second pixel circuit PC2 both in the main display area AA2, a wiring structure in the secondary display area AA1 is reduced, thereby improving the light transmittance of the secondary display area AA1.

As shown in FIG. 8, in some embodiments, the group of device layers 140 further includes a patterned semiconductor structure 146 and a patterned metal structure 147. The patterned semiconductor structure 146 is located between the buffer layer 130 and the gate insulating layer 142. The patterned metal structure 147 is located between the gate insulating layer 142 and the capacitor dielectric layer 143, and/or between the capacitor dielectric layer 143 and the interlayer dielectric layer 144, and/or between the interlayer dielectric layer 144 and the planarization layer 145. The patterned semiconductor structure 146 and the patterned metal structure 147 can form the first pixel circuit PC1 and the second pixel circuit PC2 with film layers such as the gate insulating layer 142, the capacitor dielectric layer 143, the interlayer dielectric layer 144, etc. The semiconductor structure 146 and the metal structure 147 are arranged in the main display area AA2 and are arranged to vacate the secondary display area AA1, so that the first pixel circuit PC1 and the second pixel circuit PC2 are arranged in the main display area AA2 and are arranged to vacate the secondary display area AA1.

As shown in FIG. 8 and FIG. 9, in some embodiments, the group of device layers 140 further includes a light-transmitting wire 148. The light-transmitting wire 148 electrically connects the first pixel circuit PC1 and the first light-emitting element SP1. At least a portion of the light-transmitting wire 148 is located in the secondary display area AA1. The light-transmitting wire 148 may be made of materials such as indium tin oxide (ITO) or indium zinc oxide (IZO). By setting a wire connecting the first pixel circuit PC1 and the first light-emitting element SP1 as the light-transmitting wire 148, the light transmittance of the secondary display area AA1 can be further improved.

In some embodiments, the group of light-emitting element layers 150 includes a first electrode layer 151, a second electrode layer 152, and an emitting layer (EML) 153. The second electrode layer 152 is located on a side of the first electrode layer 151 away from the substrate 120. The emitting layer 153 is located between the first electrode layer 151 and the second electrode layer 152. One of the first electrode layer 151 and the second electrode layer 152 is an anode, and the other is a cathode. In this embodiment, the description is given by taking the first electrode layer 151 as an anode and the second electrode layer 152 as a cathode, for example.

The first electrode layer 151 may be configured as a light-transmitting layer or a non-transmitting layer, or the first electrode layer 151 located in the secondary display area AA1 may be configured as a light-transmitting layer, and the first electrode layer 151 located in the main display area AA2 may be configured as a non-transmitting layer. When the first electrode layer 151 is configured as a light-transmitting layer, it may be made of materials such as ITO, IZO, etc. When the first electrode layer 151 is configured as a non-transmitting layer, the first electrode layer 151 may, for example, further include a first light-transmitting conductive layer, a reflective layer on the first light-transmitting conductive layer, and a second light-transmitting conductive layer on the reflective layer. The first light-transmitting conductive layer and the second light-transmitting conductive layer may be an ITO layer or an IZO layer, etc., and the reflective layer may be a metal layer, for example, made of silver material.

The second electrode layer 152 may be configured as a light-transmitting layer. In some embodiments, the second electrode layer 152 may be a magnesium-silver alloy layer. In some embodiments, the second electrode layer is an entire surface electrode layer.

In some embodiments, the group of light-emitting element layers 150 may further include a carrier layer, which is located between the first electrode layer 151 and the emitting layer 153, and/or between the emitting layer 153 and the second electrode layer 152. The carrier layer may be configured as a light-transmitting layer. In some other embodiments, the group of light-emitting element layers 150 may not be provided with a carrier layer.

Herein, the carrier layer refers to a carrier-related film layer used to realize functions of carrier (hole or electron) inject, transport, and blocking. In some embodiments, the carrier layer between the first electrode layer 151 and the emitting layer 153 may include at least one of a hole inject layer (HIL), a hole transport layer (HTL), an electron blocking Layer (EBL). In some embodiments, the carrier layer between the emitting layer 153 and the second electrode layer 152 may include at least one of an electron inject layer (EIL), an electron transport layer (Electron Transport Layer, ETL), and a hole blocking layer (HBL).

In some embodiments, the group of light-emitting element layers 150 may not be provided with the carrier layer; in some embodiments, the group of light-emitting element layers 150 includes the carrier layer, however, the carrier layer extends in the main display area AA2 and is arranged to vacate the secondary display area AA1. That is, in these embodiments, the secondary display area AA1 of the display panel 100 is not provided with the carrier layer, and at this time, the light transmittance of the secondary display area AA1 of the display panel 100 for light of a blue light wavelength band is significantly improved.

In some embodiments, the group of light-emitting element layers 150 further includes a pixel definition layer 155 provided with a plurality of pixel openings. The first electrode layer 151 may include a plurality of patterned first electrodes, the emitting layer 153 may include a plurality of patterned light-emitting blocks, wherein the pixel openings are arranged in a one-to-one correspondence with the first electrodes and the light-emitting blocks, the pixel openings include at least a portion of the first electrodes, and the light-emitting blocks are located in the pixel openings. Each first electrode and the light-emitting blocks and the second electrode layer 152 on a side of the first electrode away from the substrate 120 form a first light-emitting element SP1 or a second light-emitting element SP2.

In some embodiments, the group of light-emitting element layers 150 further includes a light extraction layer 156. The light extraction layer 156 is located on a side of the second electrode layer 152 away from the substrate 120. The light extraction layer 156 is configured as a light-transmitting layer, and the light extraction layer 156 is disposed in the secondary display area AA1. In some embodiments, the group of light-emitting element layers 150 may not include the light extraction layer 156.

In the fifth embodiment of the present application, the buffer layer 130 is disposed in the secondary display area AA1. The buffer layer 130 includes a first buffer sub-layer 131 and a second buffer sub-layer 132 that are stacked, and the second buffer sub-layer 132 is located on a side of the first buffer sub-layer 131 away from the substrate 120. The at least one light modulation layer 110 includes at least any one of: an eighth light modulation layer 118, a ninth light modulation layer 119, wherein the eighth light modulation layer 118 is sandwiched between the substrate 120 and the first buffer sub-layer 131, and the ninth light modulation layer 119 is sandwiched between the first buffer sub-layer 131 and the second buffer sub-layer 132. For example, in this embodiment, the at least one light modulation layer 110 includes both an eighth light modulation layer 118 and a ninth light modulation layer 119. The eighth light modulation layer 118 can increase a transmittance of light of a preset wavelength between the substrate 120 and the first buffer sub-layer 131, and the ninth light modulation layer 119 can increase a transmittance of light of a preset wavelength between the first buffer sub-layer 131 and the second buffer sub-layers 132, thereby increasing the overall light transmittance of the secondary display area AA1 on one hand, and on the other hand, a transmittance of light of a preset wavelength with a relative low light transmittance can be increased to be close to or even equal to a transmittance of light of wavelengths with a relative high light transmittance, which improves the uniformity of light transmission in each wavelength band, and improves the color fidelity of the transmitted light.

The first buffer sub-layer 131 may be a silicon nitride layer, and the second buffer sub-layer 132 may be a silicon oxide layer. The eighth light modulation layer 118 is a mixed film layer including at least two of silicon oxide, silicon nitride, and silicon. The ninth light modulation layer 119 is a mixed film layer including at least two of silicon oxide, silicon nitride, and silicon. By adjusting a composition ratio and thickness of the eighth light modulation layer 118 and the ninth light modulation layer 119 respectively, the eighth light modulation layer 118 and the ninth light modulation layer 119 can respectively have a significant anti-reflection effect.

In an example, the eighth light modulation layer 118 and the ninth light modulation layer 119 are both silicon oxynitride layers, that is, the eighth light modulation layer 118 and the ninth light modulation layer 119 are both mixed film layers formed by silicon oxide and silicon nitride. In some other embodiments, the eighth light modulation layer 118 and the ninth light modulation layer 119 may be other mixed film layers respectively, such as a mixed film layer of silicon oxide and silicon, a doped quartz film layer, and the like. The eighth light modulation layer 118 and the ninth light modulation layer 119 may be formed by coating film through chemical vapor deposition (CVD), magnetron sputtering, coating, etc., respectively, or may be obtained by integrating on the substrate 120 supplied.

In some embodiments, a refractive index of the light modulation layer 110 is between refractive indexes of two light-transmitting layers sandwiching the light modulation layer 110, so as to ensure that the light modulation layer 110 can increase a light transmittance between two light transmission layers sandwiching the light modulation layer 110. For example, in the above-mentioned fifth embodiment, a refractive index of the eighth light modulation layer 118 is between a refractive index of the substrate 120 and a refractive index of the first buffer sub-layer 131, and a refractive index of the ninth light modulation layer 119 is between the refractive index of the first buffer sub-layer 131 and a refractive index of the second buffer sub-layer 132.

In some embodiments, the refractive index of the light modulation layer 110 satisfies the following formula:

$$n_C = \sqrt{\left(\frac{1 - \sqrt{1-a}}{1 + \sqrt{1-a}}\right)(n_A \times n_B)} \qquad (4)$$

wherein $n_A$ is a refractive index of one of the two light-transmitting layers sandwiching the light modulation layer 110; $n_B$ is a refractive index of the other one of the two light-transmitting layers sandwiching the light modulation layer 110; $n_C$ is the refractive index of the light modulation layer 110; $\alpha$ is an effective rate, wherein the effective rate $\alpha$ is greater than or equal to 60%. The higher a value of the effective rate $\alpha$, the closer the refractive index $n_C$ of the light modulation layer 110 is to a geometric mean ($\sqrt{n_A \times n_B}$) of refractive indexes ($n_A$, $n_B$) of the two light-transmitting layers. The effective rate $\alpha$ being greater than or equal to 60% can ensure that the light modulation layer 110 can enhance a transmittance of light of a preset wavelength between the two light-transmitting layers.

In some embodiments, the refractive index of the light modulation layer 110 satisfies the following formula:

$$n_C = \sqrt{n_A \times n_B} \qquad (5)$$

wherein $n_A$ is a refractive index of one of the two light-transmitting layers sandwiching the light modulation layer 110; $n_B$ is a refractive index of the other one of the two light-transmitting layers sandwiching the light modulation layer 110; $n_C$ is the refractive index of the light modulation layer 110. It is equivalent to configuring the effective rate $\alpha$ in the formula (4) to be 100% to obtain the formula (5). When the refractive index $n_C$ of the light modulation layer 110 satisfies the formula (5), a better value of the refractive index $n_C$ of the light modulation layer 110 is obtained, and at this time, the light modulation layer 110 can greatly increase a transmittance of light of a preset wavelength between the two light-transmitting layers. The effective rate $\alpha$ in the above formula (4) may be understood as a degree of effectiveness that a modulation performance of the light modulation layer 110 can achieve a better modulation performance (modulation performance corresponding to a better value of the refractive index $n_C$).

The description is given by taking a configuration manner of the refractive index of the ninth light modulation layer 119 as an example, wherein the refractive index of the first buffer sub-layer 131 is substituted into $n_A$ in the formula (4), and the refractive index of the second buffer sub-layer 132 is substituted into $n_B$ in the formula (4). The effective rate is, for example, 100%, and a better value of the refractive index $n_C$ of the ninth light modulation layer 119 is obtained at this time; the effective rate is, for example, 96%, and the refractive index $n_C$ of the ninth light modulation layer 119 under a condition that the effective rate is 96% is obtained at this time.

In some embodiments, each of the at least one light modulation layers 110 includes a first portion located in the secondary display area AA1, and a thickness of the first portion satisfies the following formula:

$$T_C \times n_C = (2M+1) \times \lambda/4 \qquad (6)$$

wherein $T_C$ is the thickness of the first portion of the light modulation layer 110; $n_C$ is the refractive index of the light modulation layer 110; $\lambda$ is a wavelength of light of a preset wavelength; and M is a natural number. The wavelength $\lambda$ of the light of the preset wavelength is a wavelength of light of a required adjustment wavelength, and its dimension is consistent with a dimension of the thickness $T_C$ of the first portion of the light modulation layer 110, wherein the dimension is, for example, nanometers.

In some embodiments, each of the at least one light modulation layers 110 includes a first portion located in the secondary display area AA1, and at least one light modulation layer 110 includes a second portion located in the main display area AA2. As shown in FIG. 8, for example, in this embodiment, the ninth light modulation layer 119 includes a first portion 119a and a second portion 119b, wherein the first portion 119a of the ninth light modulation layer 119 is located in the secondary display area AA1, and the second portion 119b is located in the main display area AA2.

The description is given by taking a configuration manner of a thickness of the first portion 119a of the ninth light modulation layer 119 as an example, wherein the refractive index of the ninth light modulation layer 119 is substituted into $n_C$ in the formula (6), the wavelength of the light of the preset wavelength is substituted into $\lambda$ in the formula (6), and any natural number is substituted into M in formula (6), to obtain the thickness $T_C$ of the first portion 119a of the light modulation layer 110. In an example, the wavelength $\lambda$ of the light of the preset wavelength is, for example, 500 nanometers, and the thickness $T_C$ of the first portion 119a of the light modulation layer 110 obtained at this time can enable the first portion 119a of the ninth light modulation layer 119 to increase a transmittance of light of a wavelength of 500 nanometers between the first buffer sub-layer 131 and the second buffer sub-layer 132. According to properties of the spectrum itself, a transmittance between the first buffer sub-layer 131 and the second buffer sub-layer 132 will also increase to a certain extent for light of a range of wavelengths close to 500 nanometers (for example, light of a wavelength of 490 nanometers). Moreover, according to properties of the spectrum itself, a transmittance of light of a wavelength of an integer multiple of 500 nanometers (for example, light of a wavelength of 1000 nanometers) between the first buffer sub-layer 131 and the second buffer sub-layer 132 will also increase.

According to the display panel 100 of the embodiments of the present application, by providing the light modulation layer 110, on one hand, due to its anti-reflection effect, the overall light transmittance of the secondary display area AA1 can be increased; on the other hand, the light modulation layer 110 can increase the transmittance of some wavelengths of light with a relative low light transmittance to be close to or even equal to that of some wavelengths of light with a relative high light transmittance, which improves the uniformity of spectrum transmission and improves the color fidelity of transmitted light.

As mentioned above, the at least one light modulation layer 110 includes both the first portion located in the secondary display area AA1 and the second portion located in the main display area AA2. Film layers adjacent to two surfaces of the first portion of the light modulation layer 110 in the secondary display area AA1 may be the same as film layers adjacent to two surfaces of the second portion of the light modulation layer 110 in the main display area AA, or at least one layer may be different. The thickness of the second portion of the light modulation layer 110 may be the same as or different from the thickness of the first portion, and it is configured based on a modulation effect requirement of the light modulation layer 110 in the secondary display area AA1 and the main display area AA2. When the film layers adjacent to the two surfaces of the first portion and the film layers adjacent to the two surfaces of the second portion are the same, and the thickness of the second portion is the same as the thickness of the first portion, a modulation effect of the second portion and a modulation effect of the first portion are the same. When at least one layer of the film layers adjacent to the two surfaces of the first portion is different from the film layers adjacent to the two surfaces of the second portion, and/or the thickness of the second portion is different from the thickness of the first portion, the modulation effect of the second portion and the modulation effect of the first portion are different.

In the foregoing embodiments, the light modulation layer 110 is provided at the buffer layer 130 as an example for description, so that light anti-reflection can be performed at the buffer layer 130 and an interference of the buffer layer 130 on a chromaticity fidelity of the transmitted light can be reduced. The light modulation layer 110 may also be arranged at other film layers of the display panel 100 to improve the interference of the other film layers on the chromaticity fidelity of the transmitted light.

Figure 10:
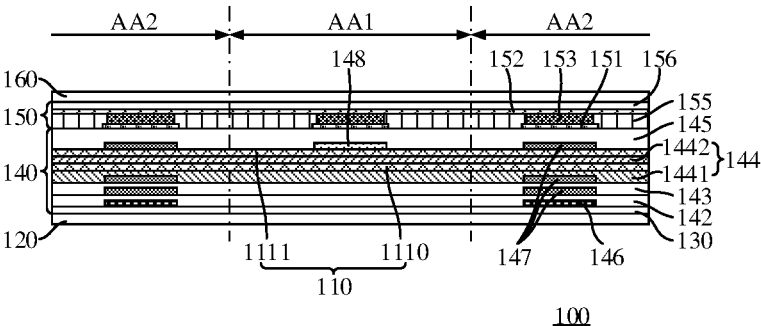
FIG. 10 is a schematic cross-sectional view of a display panel according to a sixth embodiment of present application.
Figure 11:
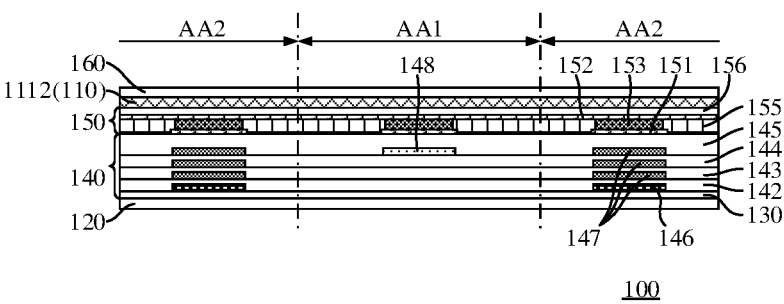
FIG. 11 is a schematic cross-sectional view of a display panel according to a seventh embodiment of present application.

FIG. 10 is a schematic cross-sectional view of a display panel provided according to a sixth embodiment of the present application, wherein FIG. 11 illustrates a cross-section of a partial area of the display panel 100. Most of the structure of the display panel 100 provided by the sixth embodiment is the same as the display panel 100 provided by the fifth embodiment. The differences between the sixth embodiment and the fifth embodiment will be described below, and the similarities will not be described in detail.

In the sixth embodiment, the interlayer dielectric layer 144 and the planarization layer 145 are disposed in the secondary display area AA1, and are arranged in a stack in the secondary display area AA1. The interlayer dielectric layer 144 includes a first sub-interlayer dielectric layer 1441 and a second sub-interlayer dielectric layer 1442 arranged in a stack. The second sub-interlayer dielectric layer 1442 is located on a side of the first sub-interlayer dielectric layer 1441 away from the substrate 120, and the at least one light modulation layer 110 includes at least any one of: a tenth light modulation layer 1110, an eleventh light modulation layer 1111. The tenth light modulation layer 1110 is sandwiched between the first sub-interlayer dielectric layer 1441 and the second sub-interlayer dielectric layer 1442. The eleventh light modulation layer 1111 is sandwiched between the second sub-interlayer dielectric layer 1442 and the planarization layer 145.

For example, in this embodiment, the at least one light modulation layer 110 includes both a tenth light modulation layer 1110 and an eleventh light modulation layer 1111. The tenth light modulation layer 1110 can increase a transmittance of light of a preset wavelength between the first sub-interlayer dielectric layer 1441 and the second sub-interlayer dielectric layer 1442. The eleventh light modulation layer 1111 can increase a transmittance of light of a preset wavelength between the second sub-interlayer dielectric layer 1442 and the planarization layer 145, thereby increasing the overall light transmittance of the secondary display area AA1 on one hand, and on the other hand, a transmittance of light of a preset wavelength with a relative low light transmittance can be increased to be close to or even equal to a transmittance of light of wavelengths with a relative high light transmittance, which improves the uniformity of light transmission in each wavelength band, and improves the color fidelity of the transmitted light.

The first sub-interlayer dielectric layer 1441 may be a silicon oxide layer, and the second sub-interlayer dielectric layer 1442 may be a silicon nitride layer. The tenth light modulation layer 1110 is a mixed film layer including at least two of silicon oxide, silicon nitride, and silicon; the eleventh light modulation layer 1111 is a mixed film layer including at least two of silicon oxide, silicon nitride, and silicon. By adjusting a composition ratio and thickness of the tenth light modulation layer 1110 and the eleventh light modulation layer 1111 respectively, the tenth light modulation layer 1110 and the eleventh light modulation layer 1111 can respectively have a significant anti-reflection effect.

In an example, the tenth light modulation layer 1110 and the eleventh light modulation layer 1111 are both silicon oxynitride layers, that is, the tenth light modulation layer 1110 and the eleventh light modulation layer 1111 are both mixed film layers formed by silicon oxide and silicon nitride. In some other embodiments, the tenth light modulation layer 1110 and the eleventh light modulation layer 1111 may be other mixed film layers respectively, such as a mixed film layer of silicon oxide and silicon, a doped quartz film layer, and the like. The tenth light modulation layer 1110 and the eleventh light modulation layer 1111 may be formed by coating film through chemical vapor deposition (CVD), magnetron sputtering, coating, etc., respectively.

FIG. 11 is a schematic cross-sectional view of a display panel provided according to a seventh embodiment of the present application, wherein FIG. 11 shows a cross-section of a partial area of the display panel 100. Most of the structure of the display panel 100 provided by the seventh embodiment is the same as the display panel 100 provided by the fifth embodiment. The differences between the seventh embodiment and the fifth embodiment will be described below, and the similarities will not be described in detail.

The differences from the fifth embodiment are that, in the seventh embodiment, the group of light-emitting element layers 150 and the encapsulation layer 160 are arranged to be separated, and the at least one light modulation layer 110 includes a twelfth light modulation layer 1112 filled between the encapsulation layer 160 and the group of light-emitting element layers 150.

In this embodiment, the group of light-emitting element layers 150 includes a first electrode layer 151, a second electrode layer 152, an emitting layer 153, a pixel definition layer 155, and a light extraction layer 156. In some embodiments, the group of light-emitting element layers 150 may not include the light extraction layer 156.

The twelfth light modulation layer 1112 is, for example, a lithium fluoride layer. In this embodiment, the twelfth light modulation layer 1112 can increase a transmittance of light of a preset wavelength between the encapsulation layer 160 and the group of light-emitting element layers 150 (the light extraction layer 156), thereby improving the overall light transmittance of the secondary display area AA1 on one hand, and on the other hand, improving the uniformity of light transmission in each wavelength band, and improving the color fidelity of the transmitted light.

In this embodiment, the display panel 100 may be a flexible display panel 100. Correspondingly, the encapsulation layer 160 is a thin-film encapsulation structure. In some embodiments, the encapsulation layer 160 includes at least one inorganic encapsulation layer and at least one organic encapsulation layer that are stacked.

In the above embodiments, the description is given by taking the display panel 100 as a flexible display panel 100 as an example. However, the concept of the present application may not be limited to being applied to a flexible display panel 100, but can also be applied to a rigid display panel 100. For example, in the above seventh embodiment, the display panel 100 may be a rigid display panel 100, wherein the encapsulation layer 160 may be an encapsulation cover made of materials such as glass or the like, the group of light-emitting element layers 150 and the encapsulation layer 160 are arranged to be separated, and the at least one light modulation layer 110 includes the twelfth light modulation layer 1112 filled between the encapsulation layer 160 and the group of light-emitting element layers 150. The twelfth light modulation layer 1112 may be formed by inkjet printing, coating, or the like.

Figure 12:
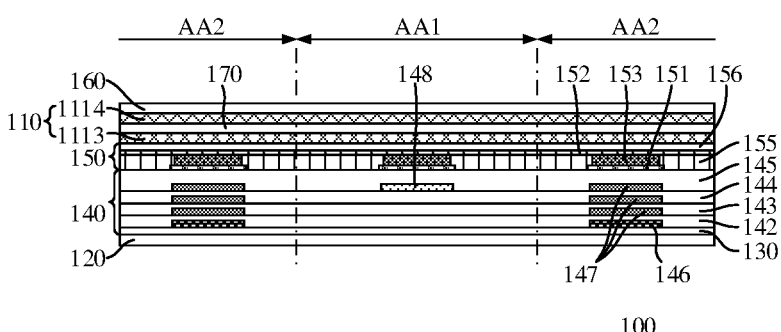
FIG. 12 is a schematic cross-sectional view of a display panel according to an eighth embodiment of present application.

FIG. 12 is a schematic cross-sectional view of a display panel 100 provided according to an eighth embodiment of the present application, wherein FIG. 12 illustrates a cross-section of a partial area of the display panel 100. Most of the structure of the display panel 100 provided by the eighth embodiment is the same as the display panel 100 provided by the fifth embodiment. The differences between the eighth embodiment and the fifth embodiment will be described below, and the similarities will not be described in detail.

The differences from the fifth embodiment are that, in the eighth embodiment, the display panel 100 is a rigid display panel 100, and the encapsulation layer 160 is an encapsulation cover made of materials such as glass or the like.

In addition, the display panel 100 further includes a vacuum layer 170, and the vacuum layer 170 is located between the group of light-emitting element layers 150 and the encapsulation layer 160.

The at least one light modulation layer 110 includes at least any one of: a thirteenth light modulation layer 1113, a fourteenth light modulation layer 1114, wherein the thirteenth light modulation layer 1113 is located between the group of light-emitting element layers 150 and the vacuum layer 170; the fourteenth light modulation layer 1114 is located between the encapsulation layer 160 and the vacuum layer 170. For example, in this embodiment, the at least one light modulation layer 110 includes both the thirteenth light modulation layer 1113 and the fourteenth light modulation layer 1114.

In some embodiments, the thirteenth light modulation layer 1113 is a lithium fluoride layer, which may be formed by evaporation, electron beam evaporation, or the like. In some embodiments, the fourteenth light modulation layer 1114 is a magnesium fluoride layer, which may be formed by magnetron sputtering, electron beam evaporation, or the like. In some embodiments, the thirteenth light modulation layer 1113 and/or the fourteenth light modulation layer 1114 may be obtained by integrating on the encapsulation layer 160 supplied.

In some other embodiments, the thirteenth light modulation layer 1113 may be another material layer with a refractive index lower than that of a film layer (the light extraction layer 156) closest to the vacuum layer 170 in the group of light-emitting element layers 150; the fourteenth light modulation layer 1114 may be another material layer with a refractive index lower than that of the encapsulation layer 160.

The thirteenth light modulation layer 1113 can increase a transmittance of light of a preset wavelength between the group of light-emitting element layers 150 and the vacuum layer 170, and the fourteenth light modulation layer 1114 can increase a transmittance of light of a preset wavelength between the encapsulation layer 160 and the vacuum layer 170. By providing the thirteenth light modulation layer 1113 and/or the fourteenth light modulation layer 1114, the overall light transmittance of the secondary display area AA1 is increased, and an interference of the encapsulation layer 160 on the chromaticity fidelity of the transmitted light is reduced.

In the above embodiments, it is described that the modulation layer 110 may be provided at the buffer layer 130 and the encapsulation layer 160 respectively. Moreover, the foregoing embodiments can be combined with each other if the technical solutions do not conflict. For example, in one embodiment, the at least one light modulation layer 110 of the display panel 100 includes the eighth light modulation layer 118, the ninth light modulation layer 119, the thirteenth light modulation layer 1113, and the fourteenth light modulation layer 1114. The eighth light modulation layer 118 is sandwiched between the substrate 120 and the first buffer sub-layer 131, the ninth light modulation layer 119 is sandwiched between the first buffer sub-layer 131 and the second buffer sub-layer 132, the thirteenth light modulation layer 1113 is located between the group of light-emitting element layers 150 and the vacuum layer 170, and the fourteenth light modulation layer 1114 is located between the encapsulation layer 160 and the vacuum layer 170.

Figure 13:
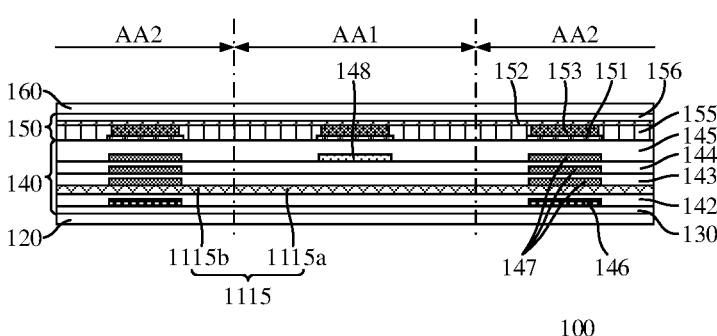
FIG. 13 is a schematic cross-sectional view of a display panel according to a ninth embodiment of present application.

FIG. 13 is a schematic cross-sectional view of a display panel 100 provided according to a ninth embodiment of the present application. FIG. 13 shows a cross section of a partial area of the display panel 100. Most of the structure of the display panel 100 provided by the ninth embodiment is the same as the display panel 100 provided by the fifth embodiment. The differences between the ninth embodiment and the fifth embodiment will be described below, and the similarities will not be described in detail.

In this embodiment, the group of device layers 140 includes a buffer layer 130, a gate insulating layer 142, a capacitor dielectric layer 143, and a planarization layer 145. The buffer layer 130 is located on the substrate 120. The gate insulating layer 142 is located on a side of the buffer layer 130 away from the substrate 120. The capacitor dielectric layer 143 is located on a side of the gate insulating layer 142 away from the substrate 120. The interlayer dielectric layer 144 is located on a side of the capacitor dielectric layer 143 away from the substrate 120. The planarization layer 145 is located on a side of the interlayer dielectric layer 144 away from the substrate 120. The buffer layer 130, the gate insulating layer 142, the capacitor dielectric layer 143, the interlayer dielectric layer 144, and the planarization layer 145 are configured as light-transmitting layers. At least one of the buffer layer 130, the gate insulating layer 142, the capacitor dielectric layer 143, or the interlayer dielectric layer 144 is disposed in the secondary display area AA1. For example, in this embodiment, the buffer layer 130, the gate insulating layer 142, the capacitor dielectric layer 143, and the interlayer dielectric layer 144 all extend both in the secondary display area AA1 and the main display area AA2.

The group of device layers 140 further includes a patterned semiconductor structure 146, and the patterned semiconductor structure 146 is located between the buffer layer 130 and the gate insulating layer 142. The semiconductor structure 146 is arranged in the main display area AA2 and is arranged to vacate the secondary display area AA1. As described above, the display panel 100 may include a first pixel circuit PC1 and a second pixel circuit PC2. The first pixel circuit PC1 and the second pixel circuit PC2 include a thin film transistor and a capacitor respectively. At least a portion of the patterned semiconductor structure 146 can be used to form an active layer of the thin film transistor.

In some embodiments, the at least one light modulation layer 110 includes a fifteenth light modulation layer 1115. The fifteenth light modulation layer 1115 includes a first portion 1115*a* located in the secondary display area AA1 and a second portion 1115*b* located in the main display area AA2. The second portion 1115*b* of the fifteenth light modulation layer 1115 is located on a side of the semiconductor structure 146 away from the substrate 120. In this embodiment, in the secondary display area AA1, the first portion 1115*a* of the fifteenth light modulation layer 1115 is sandwiched between the gate insulating layer 142 and the capacitor dielectric layer 143.

In this embodiment, in the secondary display area AA1, the first portion 1115*a* of the fifteenth light modulation layer 1115 is configured to increase a transmittance of light of a preset wavelength between the two light-transmitting layers sandwiching the first portion 1115*a*, and in the main display area AA2, the second portion 1115*b* of the fifteenth light modulation layer 1115 is configured to reduce a transmittance of light between two film layers sandwiching the second portion 1115*b*. Therefore, in the secondary display area AA1, the first portion 1115*a* of the fifteenth light modulation layer 1115 can increase the overall light transmittance of the secondary display area AA1, and can improve the uniformity of light transmission in each wavelength band, and improve the color fidelity of the transmitted light. In the main display area AA2, since the semiconductor structure 146 has a photoelectric effect on light, by reducing a light transmittance through the second portion 1115*b* of the fifteenth light modulation layer 1115, propagation of light from the group of light-emitting element layers 150 and outside to the semiconductor structure 146 can be reduced, thereby reducing an influence of light on a channel of the active layer 153 and improving the stability of the thin film transistor.

Different configurations are performed on the first portion 1115*a* and the second portion 1115*b* of the fifteenth light modulation layer 1115 respectively, so that the two portions may have different light-transmitting properties. In some embodiments, the first portion 1115*a* and the second portion 1115*b* of the fifteenth light modulation layer 1115 may be configured with different refractive indexes, respectively. In some embodiments, a thickness of the second portion 1115*b* of the fifteenth light modulation layer 1115 is different from a thickness of the first portion 1115*a* of the fifteenth light modulation layer 1115, so that the first portion 1115*a* is configured to increase a transmittance of light of a preset wavelength between the two light-transmitting layers sandwiching the first portion 1115*a*, and the second portion 1115*b* is configured to reduce a transmittance of light between two film layers sandwiching the second portion 1115*b*.

In some embodiments, when the at least one light modulation layer 110 includes a sixteenth light modulation layer located on a side of the semiconductor structure 146 facing the substrate 120, the sixteenth light modulation layer may also include a first portion located in the secondary display area AA1 and a second portion located in the main display area AA2. The first portion and the second portion of the sixteenth light modulation layer are both configured to increase a transmittance of light of a preset wavelength between the two film layers sandwiching the seventh modulation layer, so that after the light from the group of light-emitting element layers 150 and the outside passes through the semiconductor structure 146, light reflected back to the semiconductor structure 146 is reduced, which improves the stability of the thin film transistor.

According to the above-mentioned embodiments of the present application, these embodiments do not describe all the details in detail, nor do they limit the present application to only the specific embodiments described. Obviously, according to the above description, many modifications and changes can be made. This specification selects and specifically describes these embodiments in order to better explain the principles and practical applications of the present application, so that those skilled in the art can make good use of the present application and make modifications on the basis of the present application. The present application is only limited by the claims and their full scope and equivalents.

What is claimed is:

1. A display panel, comprising:
a main display area;
a light-transmitting area, wherein the main display area is arranged around at least part of the light-transmitting area;
a plurality of stacked film layers comprising a plurality of light-transmitting layers, and at least part of the light-transmitting layers being disposed in the light-transmitting area; and
at least one light modulation layer,
a substrate configured as one of the light-transmitting layers;
a buffer layer located on the substrate, wherein the buffer layer is configured as one of the light-transmitting layers,
wherein in light-transmitting area, the buffer layer comprises a first buffer sub-layer and a second buffer sub-layer arranged in a stack, and the at least one light modulation layer comprises a second light modulation layer sandwiched between the first buffer sub-layer and the second buffer sub-layer;
wherein each of the at least one light modulation layer is sandwiched between two adjacent of the plurality of light-transmitting layers disposed in the light-transmitting area,
wherein a refractive index of the at least one light modulation layer is between refractive indexes of the two light-transmitting layers under the condition of transmitting light at a preset wavelength,
wherein each of the at least one light modulation layer is configured to increase a transmittance of light of the preset wavelength between the two light-transmitting layers, and
wherein the refractive index of the at least one light modulation layer satisfies the following formula:

$$n_C = \sqrt{\left(\frac{1-\sqrt{1-a}}{1+\sqrt{1-a}}\right)(n_A \times n_B)}\ ;$$

wherein $n_A$ is a refractive index of a first of the two light-transmitting layers sandwiching the at least one light modulation layer;
$n_B$ is a refractive index of a second of the two light-transmitting layers sandwiching the at least one light modulation layer;
$n_C$ is the refractive index of the at least one light modulation layer;
$\alpha$ is an effective rate, wherein the effective rate is greater than or equal to 60%.

2. The display panel of claim 1, wherein the refractive index of the at least one light modulation layer satisfies the following formula:

$$n_C = \sqrt{n_A \times n_B}\ ;$$

wherein $n_A$ is a refractive index of one of the two light-transmitting layers sandwiching the at least one light modulation layer;

$n_B$ is a refractive index of the other one of the two light-transmitting layers sandwiching the at least one light modulation layer;

$n_C$ is the refractive index of the at least one light modulation layer.

3. The display panel of claim 1, wherein each of the at least one light modulation layer comprises a first portion located in the light-transmitting area, and a thickness of the first portion satisfies the following formula:

$$T_C \times n_C = (2\,M+1) \times \lambda/4;$$

wherein $T_C$ is the thickness of the first portion of the at least one light modulation layer;

$n_C$ is a refractive index of the at least one light modulation layer;

$\lambda$ is a wavelength of the light of the preset wavelength;

M is a natural number.

4. The display panel of claim 3, wherein the at least one light modulation layer comprises a second portion located in the main display area, and a thickness of the second portion is different from the thickness of the first portion.

5. The display panel of claim 1, wherein the light-transmitting area is a non-display area, the plurality of stacked film layers further comprise a plurality of non-transmitting layers, wherein the non-transmitting layers are disposed in the main display area and are not arranged in the light-transmitting area.

6. The display panel of claim 1, further comprising:

a group of light-emitting element layers located on a side of the group of device layers away from the substrate; and an encapsulation layer located on a side of the group of light-emitting element layers away from the substrate, wherein the encapsulation layer is configured as one of the light-transmitting layers, wherein the substrate, the buffer layer and the encapsulation layer are disposed in the light-transmitting area.

7. The display panel of claim 6, wherein the group of light-emitting element layers comprises:

a first electrode layer;

a second electrode layer located on a side of the first electrode layer away from the substrate;

a light-emitting layer located between the first electrode layer and the second electrode layer, wherein each of the first electrode layer, the second electrode layer, and the light-emitting layer is disposed in the main display area and are not arranged in the light-transmitting area;

a carrier layer located between the first electrode layer and the light-emitting layer, and/or between the light-emitting layer and the second electrode layer, wherein the carrier layer is disposed in the light-transmitting area, or the carrier layer is disposed in the main display area and is not arranged in the light-transmitting area;

a light extraction layer located on a side of the second electrode layer away from the substrate, wherein the light extraction layer is configured as one of the light-transmitting layers, and the light extraction layer is disposed in the light-transmitting area.

8. The display panel of claim 1, wherein the at least one light modulation layer comprises a first light modulation layer sandwiched between the substrate and the buffer layer.

9. The display panel of claim 8, wherein the first light modulation layer is a mixed film layer comprising at least two of silicon oxide, silicon nitride, and silicon.

10. The display panel of claim 1, wherein the first buffer sub-layer is a silicon nitride layer, the second buffer sub-layer is a silicon oxide layer, and the second light modulation layer is a mixed film layer comprising at least two of silicon oxide, silicon nitride, and silicon.

* * * * *